(12) United States Patent  (10) Patent No.: US 8,337,214 B2
Sheek  (45) Date of Patent: Dec. 25, 2012

(54) ELECTRICAL CONNECTORS AND LIGHT EMITTING DEVICE PACKAGE AND METHODS OF ASSEMBLING THE SAME

(75) Inventor: Kevin Todd Sheek, Greensboro, NC (US)

(73) Assignee: Cree, Inc., Durham, NC (US)

( * ) Notice: Subject to any disclaimer, the term of this patent is extended or adjusted under 35 U.S.C. 154(b) by 82 days.

(21) Appl. No.: 12/719,287

(22) Filed: Mar. 8, 2010

(65) Prior Publication Data

US 2011/0116275 A1    May 19, 2011

Related U.S. Application Data

(60) Provisional application No. 61/260,920, filed on Nov. 13, 2009.

(51) Int. Cl.
*H01R 12/00* (2006.01)
(52) U.S. Cl. .............. 439/56; 439/65; 439/79
(58) Field of Classification Search ............ 439/56, 439/65, 79, 83, 62
See application file for complete search history.

(56) References Cited

U.S. PATENT DOCUMENTS

| | | | | |
|---|---|---|---|---|
| 4,600,256 | A | * | 7/1986 | Anttila .............. 439/65 |
| 5,108,295 | A | | 4/1992 | Koike et al. |
| 5,666,721 | A | * | 9/1997 | Sakemi ............. 29/843 |
| 6,109,933 | A | * | 8/2000 | Lenoir et al. ........... 439/79 |
| 7,044,620 | B2 | | 5/2006 | Van Duyn |
| 7,549,786 | B2 | | 6/2009 | Higley et al. |
| 7,621,752 | B2 | * | 11/2009 | Lin et al. ............ 439/56 |
| 2006/0001361 | A1 | | 1/2006 | Imai et al. |
| 2006/0197101 | A1 | | 9/2006 | Wu |
| 2006/0279962 | A1 | | 12/2006 | Loh |
| 2006/0292747 | A1 | | 12/2006 | Loh |
| 2009/0154160 | A1 | | 6/2009 | Li et al. |
| 2010/0149771 | A1 | | 6/2010 | Villard et al. |

OTHER PUBLICATIONS

Gregory S. Bibee, U.S. Appl. No. 12/574,918 entitled "Methods and Apparatus for Mounting and Electrical Connection," filed Oct. 7, 2009.
Markle et al., U.S. Appl. No. 12/579,946 entitled "Lamp Assemblies and Methods of Making the Same," filed Oct. 15, 2009.

* cited by examiner

*Primary Examiner* — Tho D Ta
(74) *Attorney, Agent, or Firm* — Jenkins, Wilson, Taylor & Hunt, P.A.

(57) ABSTRACT

Electrical connectors for attachment to electrical contacts of light emitting devices as well as light emitting device packages and lamp assemblies that use such connectors are provided. Further, methods for assembling light emitting device packages that use such connectors are provided. The electrical connector, for example, can have a plug housing with an electrically conductive socket engaging connection for engaging a socket. The electrical connector can also have an electrically conductive member extending from the plug housing and connected to the socket engaging connection. The electrically conductive member can have an end distal from the plug housing that forms a contact base configured to attach to an electrical contact on a light emitting device.

49 Claims, 8 Drawing Sheets

ELECTRICAL CONNECTORS AND LIGHT EMITTING DEVICE PACKAGE AND METHODS OF ASSEMBLING THE SAME

CROSS REFERENCE TO RELATED APPLICATIONS

This non-provisional patent application claims priority to U.S. Provisional Patent Application Ser. No. 61/260,920, filed on Nov. 13, 2009, the contents of which are incorporated by reference herein.

TECHNICAL FIELD

The presently disclosed subject matter relates generally to electrical connectors and light emitting devices and packages that use such electrical connectors. More particularly, the present subject matter relates to electrical connectors that provide flexibility for light-emitting device package mounting and electrical connection arrangements for lamp assemblies and methods of assembling light-emitting device packages using such electrical connectors.

BACKGROUND

Light-emitting devices such as semiconductor light-emitting diodes, organic light-emitting diodes, or polymer light-emitting diodes as sources of illumination rather than electrical filaments, plasma (used in arc lamps such as fluorescent lamps), or gas are becoming more common in use. Various implementations of light-emitting device lighting fixtures are becoming available in the marketplace to fill a wide range of applications. Such different lighting application in which light-emitting devices can be used include domestic lighting, billboard and display lighting, automotive and bicycle lighting, emergency lighting, traffic and railway lighting, and floodlight and flashlight use. Light-emitting devices are smaller than incandescent bulbs and use less energy. In addition, light-emitting devices have a longer life than standard incandescent light bulbs. Accordingly, the use of light-emitting diodes in lighting applications can provide significant energy savings, increased lamp life, smaller lamp size, and flexibility in the design. For these reasons, lighting manufacturers are increasingly interested in unique lighting fixtures incorporating light-emitting diodes that may also have appeal to their intended customers. Lighting manufacturers are also increasingly interested in improving manufacturability costs and processes to provide cost-effective lighting solutions.

In such applications, one or more light emitting device dies (or chips) are mounted within a light emitting device package or on an light emitting device module, which may make up part of a light emitting device lighting fixture which includes one or more power supplies to power the light emitting devices.

While providing many benefits, light-emitting diode lighting fixtures can be time consuming to manufacture and can therefore be expensive. The use of solder in the manufacturing process can raise cost and safety concerns. Improvements in manufacturing efficiency and costs are therefore needed. Further, heat dissipation needs have to be addressed with light-emitting diodes. Some light emitting device packages have been developed that provide the electrical contacts on the top side of the packages. Such a design can create issues for connecting the packages in a conventional manner. Many times the package can have a ground slug or a heat sink that covers the entire bottom that can interior with reflow and other techniques used for mounting and circuit connection.

SUMMARY

In accordance with this disclosure, novel electrical connectors, such as plugs, for attachment to one or more electrical contacts of a light emitting device package and light emitting device packages and lamp assemblies that use such electrical connectors are provided. It is, therefore, an object of the present disclosure to provide electrical connectors for use with light-emitting device packages that provide electrical connections with boards, such as circuit boards.

This and other objects of the present disclosure as can become apparent from the present disclosure are achieved, at least in whole or in part, by the subject matter described herein.

BRIEF DESCRIPTION OF THE DRAWINGS

A full and enabling disclosure of the present subject matter including the best mode thereof to one of ordinary skill in the art is set forth more particularly in the remainder of the specification, including reference to the accompanying figures, in which:

FIG. 28 illustrates a top view of the light-emitting diode package of FIG. 2A;

DETAIL DESCRIPTION

Reference will now be made in detail to the description of the present subject matter, one or more examples of which are shown in the figures. Each example is provided to explain the subject matter and not as a limitation. In fact, features illustrated or described as part of one embodiment can be used in another embodiment to yield still a further embodiment. It is intended that the present subject matter cover such modifications and variations.

As illustrated in the figures, some sizes of structures or portions are exaggerated relative to other structures or portions for illustrative purposes and, thus, are provided to illustrate the general structures of the present subject matter. Furthermore, various aspects of the present subject matter are described with reference to a structure or a portion being formed on other structures, portions, or both. As will be appreciated by those of skill in the art, references to a structure being formed "on" or "above" another structure or portion contemplates that additional structure, portion, or both may intervene. References to a structure or a portion being formed "on" another structure or portion without an intervening structure or portion are described herein as being formed "directly on" the structure or portion.

Furthermore, relative terms such as "upper," "lower," "top," "bottom," "on" or "above" are used herein to describe one structure's or portion's relationship to another structure or portion as illustrated in the figures. It will be understood that relative terms such as "upper," "lower," "top," "bottom," "on" or "above" are intended to encompass different orientations of the device in addition to the orientation depicted in the figures. For example, if the device in the figures is turned over, structure or portion described as "above" other structures or portions would now be oriented "below" the other structures or portions. Likewise, if the device in the figures is rotated along an axis, stricture or portion described as "above", other structures or portions would now be oriented "next to" or "left of" the other structures or portions. Like numbers refer to like elements throughout.

Different light-emitting device packages and lamp assemblies can be used with the electrical connectors disclosed herein. For example, various patents and patent applications assigned to the assignee of the present application disclose light-emitting device packages that can used such electrical connectors. See, for example: U.S. Pat. No. 7,549,786; U.S. application Ser. No. 12/335,631; U.S. patent application Ser. No. 12/574,918 filed Oct. 7, 2009; and U.S. patent application Ser. No. 12/579,946 filed on Oct. 15, 2009, all of which are incorporated by reference herein in their entireties. FIGS. 1A, 1B, and 2A-B illustrate examples of light-emitting device packaging arrangements having top mounted electrical contacts that can be used with electrical connectors disclosed herein.

Figure 1A:
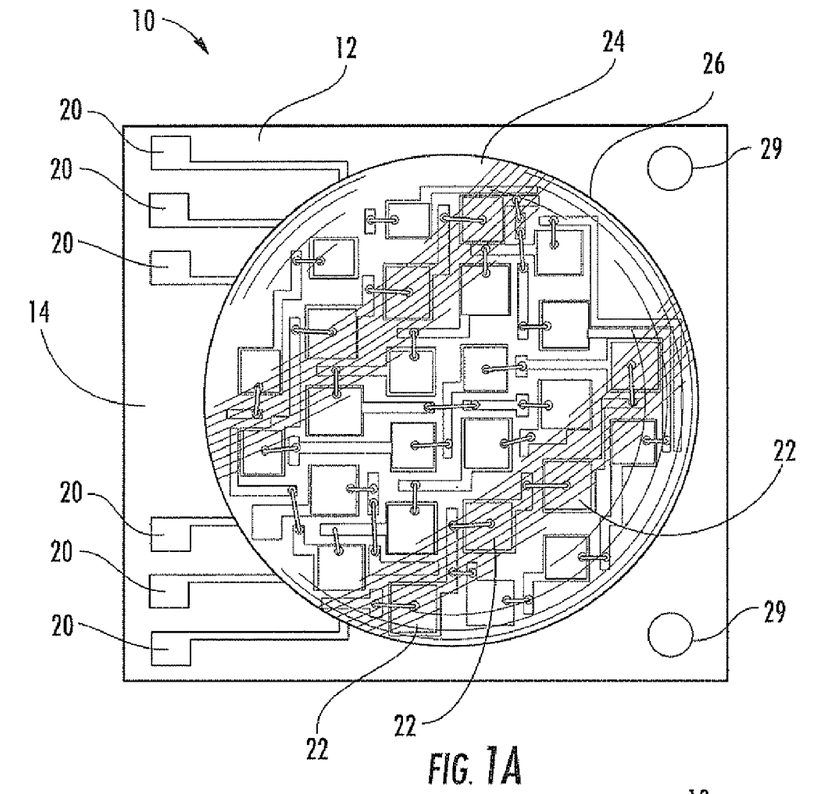
FIG. 1A illustrates a top view of one example of a light-emitting diode package.
Figure 1B:
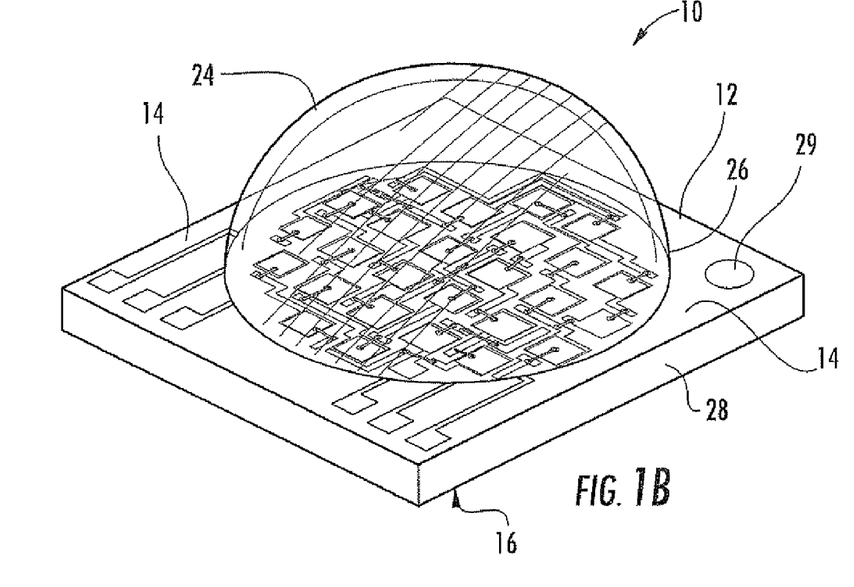
FIG. 1B illustrates a perspective view of the embodiment of the light-emitting diode package shown in FIG. 1A.

FIGS. 1A and 1B illustrate a light-emitting device package 10 that can be used in the lamp assemblies disclosed herein. The light-emitting device package 10 can comprise a substrate 12 having a top surface 14 and bottom surface 16. Substrate 12 can be a material such as, for example, silicon, copper, silver, FR4, aluminum, thermally conductive polycarbonate, or other suitable material. Substrate 12 may be formed of many different materials, including electrically insulating materials. Suitable substrate materials also can comprise, but are not limited to, ceramic materials such as aluminum nitride (AlN) and alumina (Al$_2$O$_3$). Dimensions of substrate 12 can vary widely depending on the applications and processes used to manufacture light-emitting diode package 10 and the lamp assembly in which it is used.

The light-emitting device package 10 can comprise electrical contacts 20. In one aspect, electrical contacts 20 can be disposed only on the top surface 14 of the substrate 12. For example, electrical contacts 20 can be electrically connected to one or more light-emitting device chips 22, such as light-emitting diode chips, (see FIG. 1A) in a known manner as understood by one of ordinary skill in the art. In the embodiment shown in FIGS. 1A and 1B, six electrical contacts 20 are shown. The number of electrical contacts 20 can vary and can be dependent upon the number of light-emitting device chips 22 used in the light-emitting device package 10. The number of light-emitting device chips 22 can, for example, vary between about 1 to about 25 or more for a given package size. More light-emitting device chips such as chips 22 can be included in larger package sizes. The light-emitting device chips 22 can be connected in series. For example, alternating lines of red light producing light-emitting device chips 22 and white light producing light-emitting device chips 22 can be used in the light-emitting device package 10. Thus, the manner in which the light-emitting device chips 22 are connected can also affect the number of electrical contacts 20 in the light-emitting device package 10.

By having the electrical contacts 20 only on the top surface 14 of the substrate 12 as shown in one aspect, light-emitting device package 10 can be formed on a larger wafer of the substrate material with the wafer being cut into individual light-emitting device packages 10 with substrate 12 having sides 28. While the substrate 12 is shown to have a rectangular plan view shape, the substrate can vary in size and shape. The top surface 14 can also comprise markers 29 that can aid a user in determining the orientation of the light-emitting device package 10 when being installed.

The light-emitting device chips 22 can be covered by a lens 24. The lens 24 can be formed of different material. For example, encapsulation material can be used to encapsulate the light-emitting device chips 22 and their associated bonding wires and mounting pads in a compression mounting process to form the lens 24. Other lens material can be used. In the embodiment shown, the lens 24 is formed into a domed shape. The dome shape of the lens 24 can be generally a hemispherical shape with the base 26 of the lens 24 having the greatest diameter. Other lens shapes can be used.

Figure 2A:
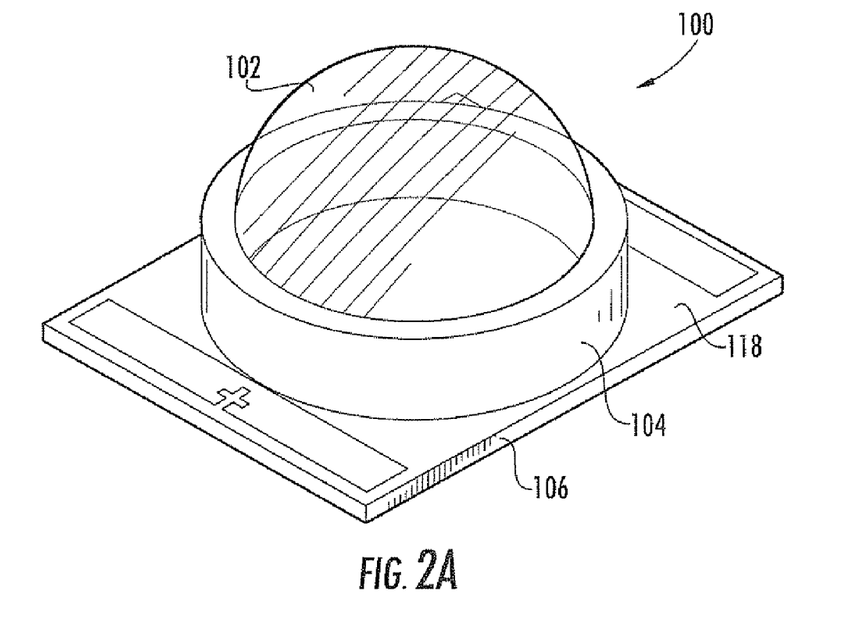
FIG. 2A illustrates a perspective view of another example of a light-emitting diode package.
Figure 2B:
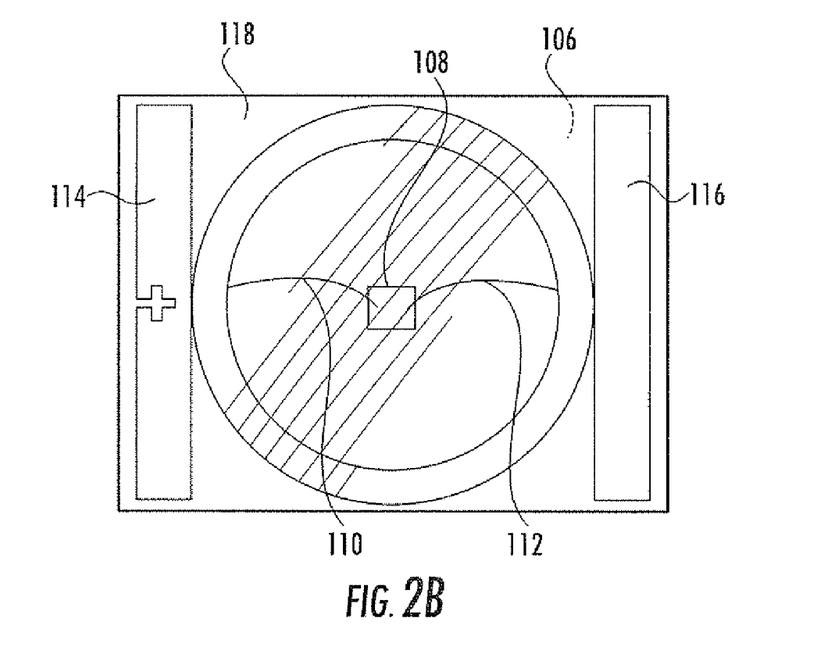

As seen in FIG. 2A, light-emitting device package 100 can comprise a lens 102, a reflector 104 and a mounting substrate 106. As seen in FIG. 2B, a chip 108, such as a light-emitting diode chip, can be electrically connected by bond wires 110 and 112 to electrical contacts, such as electrical contact strips 114 and 116, respectively, on the substrate 106 which can suitably be a printed circuit board (PCB), such as a flame resistant 4 (FR4) board. When power is applied through the contacts 114 and 116, chip 108 can emit light. The chip 108 is shown as having two top contacts for a chip having a horizontal arrangement. However, alternative chips and chip mounting arrangements can be used where the LED has a horizontal or vertical orientation or is flip chip mounted, as would be understood by one of ordinary skill in the art. In the arrangement shown, reflector 104 can help direct the emitted light upward and the lens 102 can focus the emitted light. The chip 108 can be thermally mounted on top surface 118 of substrate 106 with a thermal bonding paste.

FIGS. 3A-3D illustrate electrical connectors 210, 220, 230, 240, respectively, for use with a light emitting device package as shown in FIGS. 1A-2B and 4A-4B that can comprise an electrical contact. The electrical connectors 210, 220, 230, 240, can be a plug for connection to an electrical source such as for insertion into a suitable electrical receptacle. The electrical connectors 210, 220, 230, 240 can be easily mounted on electrical contacts 314 (FIG. 4A, B) of the light emitting device package to provide ease of connection of a board, such as a circuit board to create a lamp assembly. The electrical connectors 210, 220, 230, 240 can be positioned to achieve a high light intensity, with a low amount of light degradation possible. Light degradation can be reduced, for example, when an electrical connector 210, 220, 230, 240 is aligned longitudinally in a position substantially parallel to a plane of a substrate of the light emitting device package as will be explained further below.

Figure 3A:
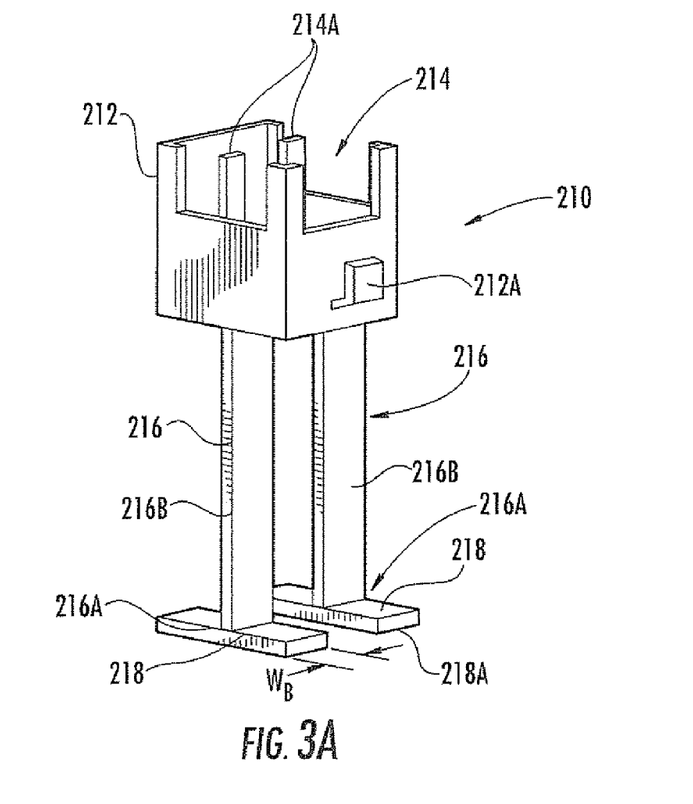
FIGS. 3A-D illustrate a perspective view of connecting member devices in accordance with the subject matter herein.

FIG. 3A illustrates the electrical connector 210 that can be a plug for connection to an electrical source. For example, the electrical source can be a receptacle that is a conduit for electricity, for instance, a socket. The electrical connector 210, or plug, can comprise a plug housing 212 with an electrically conductive socket engaging connection 214 therein for engaging a socket. The style and shape of the plug can vary greatly. The electrically conductive socket engaging connection 214 can be any type of connection that can engage a corresponding socket to provide an electrical connection. For example, the electrically conductive socket engaging connection 214 of the plug housing can comprise one or more pins 214A. The plug housing 212 can have a securement device, such as tab 212A that is used to hold the plug and the electrically conductive socket engaging connection 214 within a socket in which it is inserted. The plug housing 212 can be made from a material that can be nonconductive, or dielectric. For example, the plug housing 212 can be made from a plastic. In some embodiments, the plug housing 212 can be made from a heat resistant plastic.

The electrical connector 210 can comprise one or more electrically conductive members 216 that can extend outward from the plug housing 212. The members can be of any suitable configuration, shape and material such as, for example, electrically conductive bars. The conductive members 216 can be rigid, but bendable. The conductive members 216 can be fashioned to extend in any suitable direction outward from the plug housing, such as for example straight or any other suitable angle with respect to the plug housing 212. The number of electrically conductive members 216 can vary. For example, one electrically conductive member 216 or more than six electrically conductive members 216 can be provided. The number of electrically conductive members 216 can generally correspond to the number of contacts on the light emitting device on which the electrical connector 210 is attached. The electrically conductive members 216 can be connected to the socket engaging connection 214. In this manner, electricity can be conducted through the socket engaging connection 214 to the electrically conductive members 216. In embodiments where the electrically conductive socket engaging connection 214 of the plug housing comprises one or more pins 214A, the number of pins 214A can correspond to the number of electrically conductive members 216.

Each electrically conductive member 216 can comprise an end 216A distal from the plug housing 212 that can form a contact base 218. The contact base 218 can be configured to attach to the electrical contact on a light emitting device package. As shown in FIG. 3A, each electrically conductive member 216 can comprise an upper portion 216B and the contact base 218 of the electrically conductive members 216 can form a pad 218A from which the upper portion 216B extends. For example, the pad 218A formed by the contact base 218 of each electrically conductive member 216 can be disposed along or in a plane $X_C$ (See FIG. 4A) that can be at least generally or at least about orthogonal to the upper portion 216B of the electrically conductive member 216.

The pads 218A can be wider than the upper portions 216B. In such an embodiment, the upper portions 216B can extend upward from a middle portion of the pads 218A formed by the contact base 218. The pads 218A can alternatively be the same width of the upper portion 216B. The contact base 218 can have a width $W_B$ that can be substantially similar to the width of the electrical contacts of a light emitting device package. In some embodiments, the width $W_B$ of the contact base 218 can be wider than the corresponding electrical contact. In some embodiments, the width $W_B$ of the contact base 218 can be thinner than the corresponding electrical contact.

The electrically conductive member 216 can be configured to bend proximal to the contact base 218. In this manner, once the electrical connector 210 is attached to a light emitting device package, the electrical connector 210 can be bent to a position that will provide a high light intensity of the light-emitting device by reducing the amount of light blocked by the electrical connector 210.

Figure 4A:
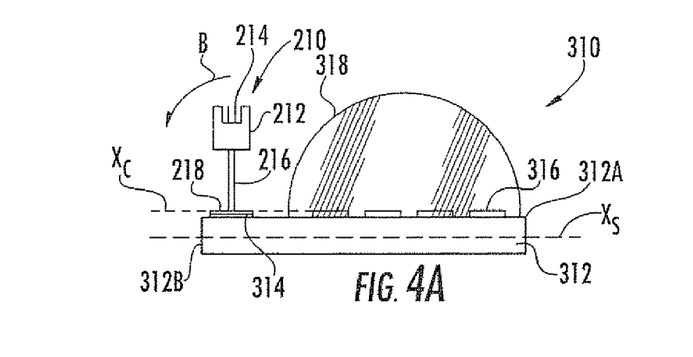
FIGS. 4A-B illustrate a perspective view of a lamp assembly device with connecting member devices.

The configuration of the plug housing 212, the electrically conductive members 216 and their contact bases 218 can be such that the electrical connector 210 can stand on the contact bases 218 with the upper portions 216B of the electrically conductive members 216 and the plug housing 212 extending upward. In other configurations, a jig can also be used to hold the electrical connector 212 such that the contact bases 218 reside on a surface, like an electrical contact, with the upper portions 216B of the electrically conductive members 216 and the plug housing 212 extending upward. By having the plug housing 212 and the socket engaging connection 214 positioned on the electrically conductive member 216 so that they are spaced apart from the substrate 312 and the electrical contact 314 when the electrically conductive member 216 is placed on the electrical contact 314 as shown in FIGS. 3A and 4A, the contact base 218 can be attached to the electrical contact 314 without the attachment procedure (through heat or other manner) interfering with the plug housing 212 and the socket engaging connection 214. After attachment, the electrically conductive member 216 can be bent so that the plug housing 212 or the electrically conductive member 216 is closer to the substrate 312 and further out of the way of the light that can be emitted by the light emitting device.

Figure 3B:
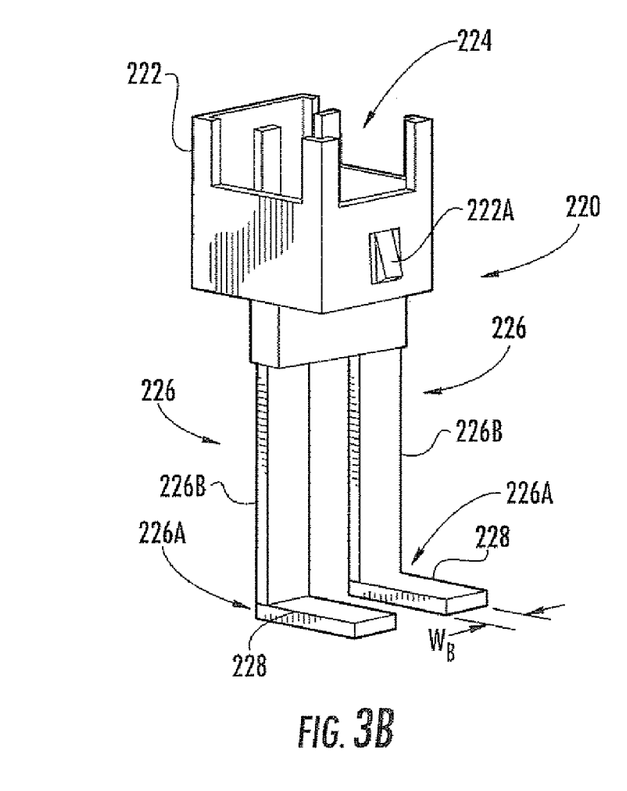

FIG. 3B illustrates another electrical connector 220. As above, the electrical connector 220 can comprise a plug housing 222 with an electrically conductive socket engaging connection 224 therein for engaging a socket. The plug housing 222 can have a securement device 222A that can be used to hold the plug 222 and the electrically conductive socket engaging connection 224 within a socket in which it is inserted. The electrical connector 220 can comprise one or more electrically conductive members 226 that can extend outward from the plug housing 222. The electrically conductive members 226 can be connected to the socket engaging connection 224. In this manner, electricity can be conducted through the socket engaging connection 224 to the electrically conductive members 226. The conductive members 226 can in one aspect be rigid, but bendable. Each electrically conductive member 226 can comprise an end 226A distal from the plug housing 222 that can form a contact base 228 for attaching to the electrical contact on a light emitting device package.

As shown in FIG. 3B, each electrically conductive member 226 can be angled at the contact base 228. In this manner, each electrically conductive member 226 can have an upper portion 226B that can extend in one direction with the contact base 228 extending in a different direction. The angle formed between the upper portion 226B and the contact base 228 can vary between embodiments. The angle can be such that the electrical connector 220 can stand upright on the contact bases 228 of the electrically conductive members 226. The electrical connector 228 can thus possibly stand on the light emitting device package during attachment without assistance. Alternatively, the angle can be such that assistance is needed to hold electrical connector 220 in an "upright" position. For example, a jig can be used to hold the electrical connector 228 in place during attachment.

In the embodiment shown, the contact base 228 of the each electrically conductive member 226 can reside in a plane $X_C$ (See FIG. 5A) that can be at least generally or at least about orthogonal to the upper portion 226B of the respective electrically conductive member 226. As above, the contact base 228 can have a width $W_B$ that is substantially similar to the width of the electrical contacts of a light emitting device package. The electrically conductive member 226 can be configured to bend proximal to the contact base 228. In this manner, once the electrical connector 220 is attached to a light emitting device package, the electrical connector 220 can be bent to a position that will increase light out by reducing the amount of light blocked by the electrical connector 220.

Figure 3C:
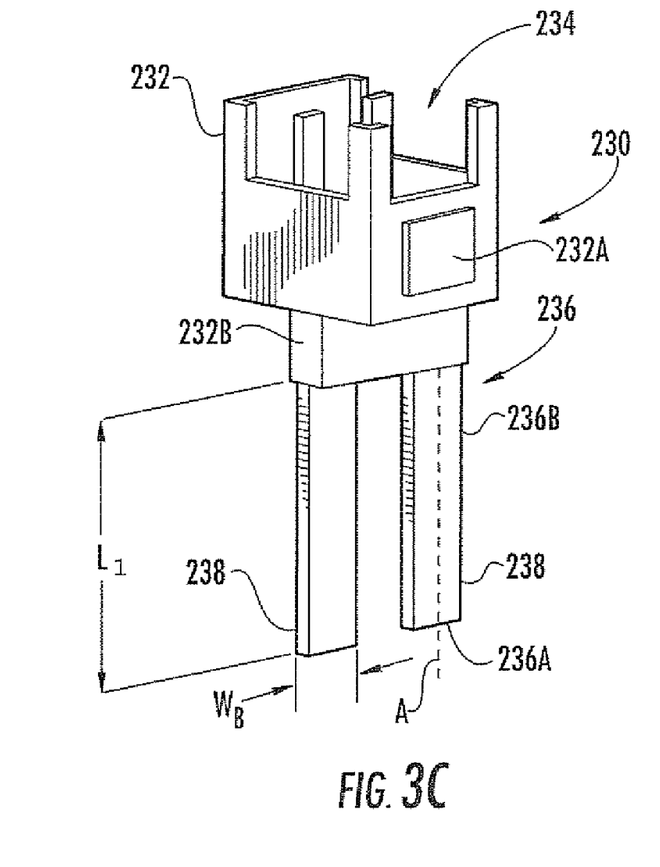
Figure 3D:
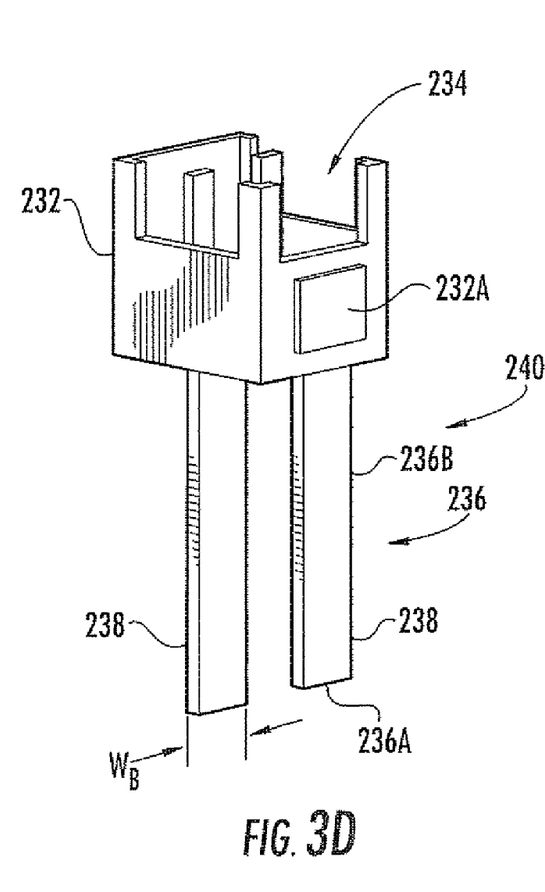

FIGS. 3C and 3D illustrate similar embodiments of further electrical connectors 230 and 240. The main difference between the two embodiments, for example, is the shape of plug housings 232 used. For example, the plug housing 232 in FIG. 3C can comprise a support 232B at its bottom through which electrically conductive members 236 enter into plug housing 232.

Therefore, the rest of the description herein can apply to both embodiments shown in FIGS. 3C and 3D.

As above, the electrical connector 230 can comprise a plug housing 232 with an electrically conductive socket engaging connection 234 therein for engaging a socket. The plug housing 232 can have a securement device 232A that is used to hold the plug housing 232 and the electrically conductive socket engaging connection 234 within a socket in which it is inserted. The electrical connector 230 can comprise one or more electrically conductive members 236 that can extend outward from the plug housing 232. The electrically conductive members 236 can be connected to the socket engaging connection 234 in a manner to provide an electrical connection. The conductive members 236 can in one aspect be rigid, but bendable.

Each electrically conductive member 236 can comprise an end 236A distal from the plug housing 232 that forms a contact base 238 for attaching to the electrical contact on a light emitting device package. As shown in FIG. 3C, each electrically conductive member 236 can be planar such that the contact base 238 and the rest of the electrically conductive member 236 can extend from the plug housing 232 along the same axis A. As above, the contact base 238 can have a width $W_B$ that can be substantially similar to the width of the electrical contacts of a light emitting device package. Each electrically conductive member 236 can have a length $L_1$ so that when the contact base 238 of the respective electrically conductive member 236 is being connected to a contact pad of a light emitting device package, the plug housing 232 and the electrically conductive socket engaging connection 234 are generally unaffected by the heat generated by the attachment or connection process. In such an embodiment, once the electrical connector 230 is attached to a light emitting device package, the electrical connector 230 can reside in a position that will increase light output by reducing the amount of light blocked by the electrical connector 230.

Figure 4B:
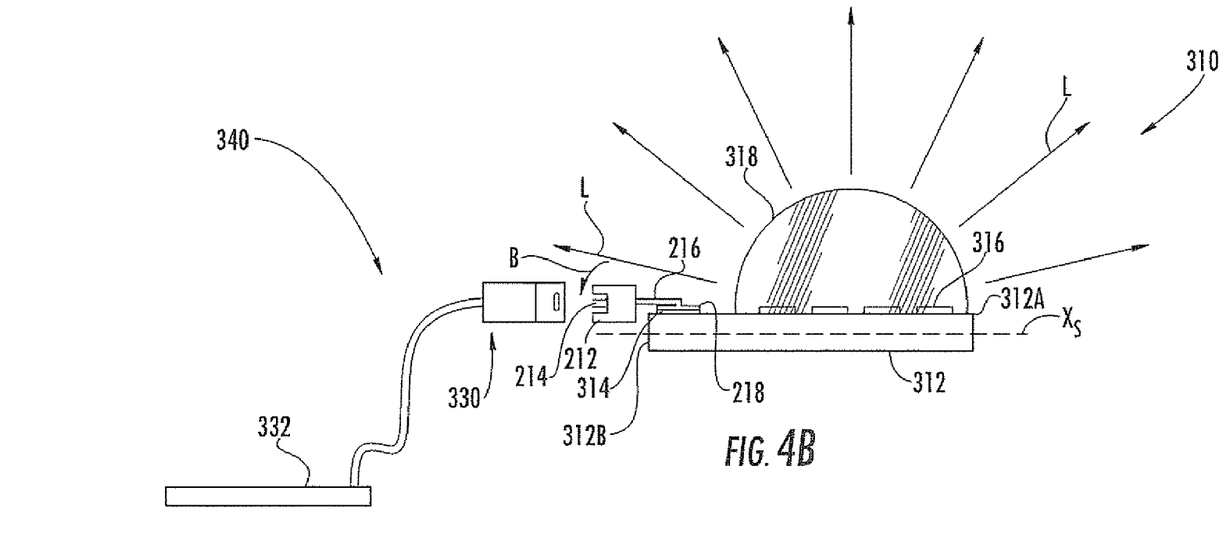

FIGS. 4A-B illustrate light-emitting device packages as described above that comprise electrical connectors attached to the electrical contacts that can be engaged by sockets to electrical connect the light-emitting device packages to boards, such as circuit board, for example, printed circuit boards. For example, as shown in FIGS. 4A and 4B, a light emitting device package, generally designated 310, is provided that can comprise a substrate 312. The substrate 312 can comprise one or more electrical contacts 314 disposed thereon that can be adjacent to or near an edge of the substrate. For example as shown, the contacts 314 can be on the top surface 312A of the substrate 312. The light emitting device package 310 can also comprise one or more light emitting devices, such as light emitting diodes 316. The light emitting diodes 316 can be covered by a lens 318. For example, the lens 318 can encapsulate the light emitting diodes 316.

The light emitting device package 310 can also comprise electrical connector 210 similar to the one described above with regard to FIG. 3A. The electrical connector 210 can be attached to the electrical contacts 314. The electrical connector 210 can comprise a plug housing 212 with an electrically conductive socket engaging connection 214 therein for engaging a socket 330 of a board, such as circuit board 332, shown in FIG. 4B. The electrical connector 210 can also comprise one more electrically conductive members 216 that can extend from the plug housing 212 and can be connected to the socket engaging connection 214. As above, each electrically conductive member 216 can comprise an end distal from the plug housing 212 that can form a contact base 218 in the form of a pad from which the upper portion of the electrically conductive member 216 extends. Contact base 218 can be attached to the electrical contacts 314 on the light emitting device and can be attached to the electrical contacts 314 in different ways known by those of ordinary skill in the art. For example, the contact base 218 can be attached to the electrical contacts 314 by solder reflow.

By using solder reflow techniques, all the mounting of the parts of the light emitting device package 310 can be performed in one step. When using reflow techniques, solder paste can be placed between the electrical contacts 314 and the contact bases 218 of the electrically conductive members 216. The electrical connector 210 can reside upright before and during reflow so that contact base 218 resides on the contact 314 in a plane $X_C$ about parallel to a plane $X_s$ in which the substrate 312 resides with the electrically conductive member 216 extending about perpendicular to both the contact base 218 and the substrate 312. By having the electrically conductive member 216 with the contact base 218 disposed between the substrate 312 with electrical contact 314 and the plug housing 212 with the electrically conductive socket engaging connection 234, the plug housing 212 is substantially shielded from heat during the reflow.

After the reflow, the light emitting device package 310 can be cooled. The electrically conductive member 216 portion can be mechanically deformed or bent in a direction B so that the upper portion of the electrically conductive member 216 above the contact base 218 can be at least about parallel with the plane $X_s$ of the substrate 312 and such that the plug housing 212 can be at or near the side 312B of the substrate 312. In this manner, the electrical connector 210 and its plug housing 212 can be moved to a position to achieve an increased light intensity, with the least amount of light degradation or interference possible. Once the electrical connector 210 and its plug housing 212 are in this position, the plug housing 212 and the socket engaging connection 214 therein can be plugged into the socket 330 of the board 332 to create a lamp assembly 340 to provide a connection that can produce the intend light. As shown, the light L can radiate outward throughout the lens 318. This includes the light that would otherwise be blocked by an electrical connector that would extend higher above the electrical contact 314.

Figures 5A, 5B:
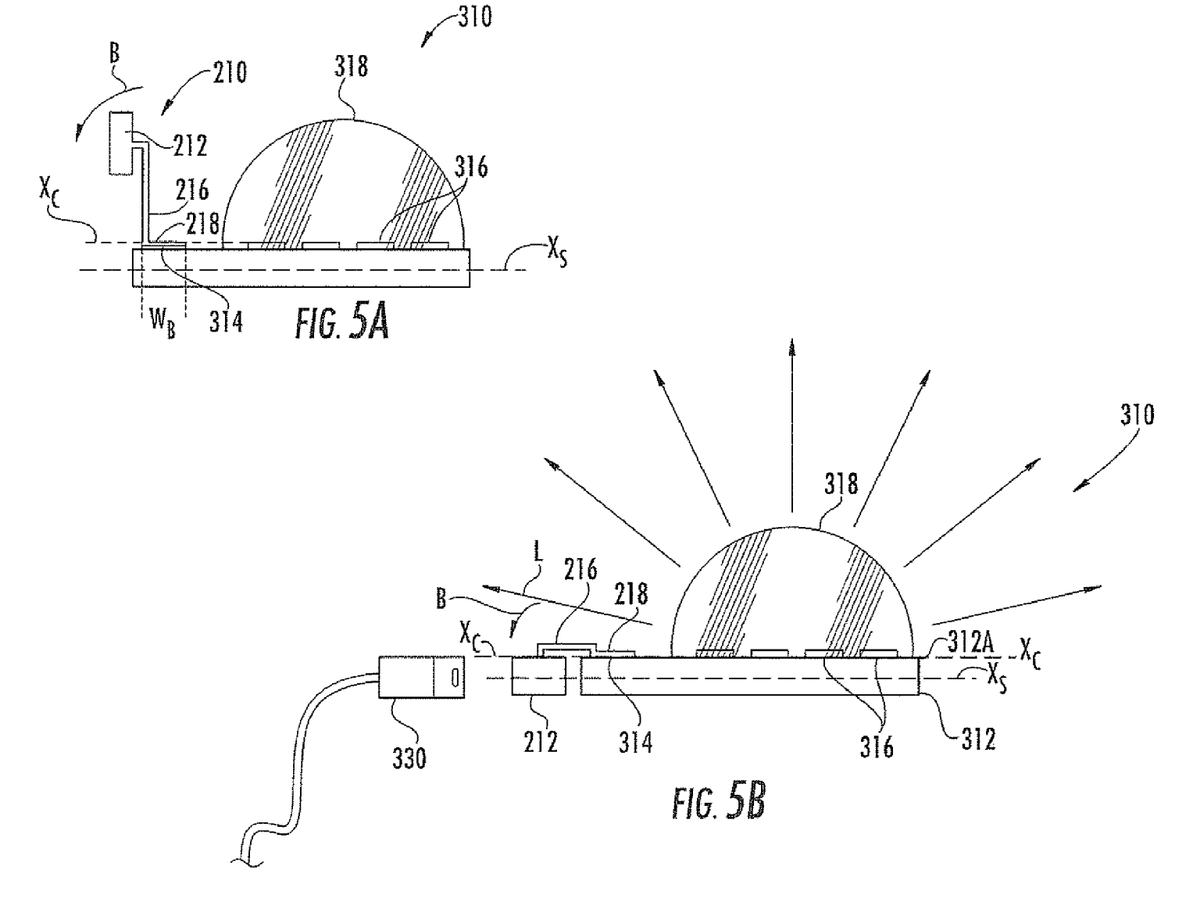
FIGS. 5A-B illustrate embodiments with a lamp assembly device with connecting member devices.

FIG. 5A illustrates one embodiment where the electrical connector 210 of the light emitting device package generally designated as 310 can stand upright on the contact bases 218 of the electrically conductive members 216. The light emitting device package 310 can comprise a substrate 312. The substrate 312 can have one or more electrical contacts 314 disposed thereon that can be adjacent to or near an edge of the substrate. For example, the contacts 314 can be on the top surface 312A of the substrate 312. The light emitting device package 310 can also comprise one or more light emitting devices, such as light emitting diodes 316. The light emitting diodes 316 can be covered by a lens 318. For example, the lens 318 can encapsulate the light emitting diodes 316. The electrical connector 218 can possibly stand on the light emitting device package during attachment without assistance. Alternatively, the embodiment can be such that assistance is needed to hold electrical connector 210 in an "upright" position. For example, a jig can be used to hold the electrical connector 218 in place during attachment.

In the embodiment shown, the contact base 218 of each electrically conductive member 216 can reside in a plane $X_C$ that can be at least generally or at least about orthogonal to the respective electrically conductive member 216. As above, the contact base 218 can have a width $W_B$ (see FIG. 3A) that can be substantially similar to the width of the electrical contacts of a light emitting device package. The electrically conductive member 216 can be configured to bend, for example, but is not limited to any specific mechanical bending process, proximal to the contact base 218. As above, the bending direction is shown in FIG. 5A as the curved arrow B. In this manner, once the electrical connector 210 is attached to a light emitting device package, the electrical connector 210 can be bent in a direction B to a position as shown in FIG. 5B that will increase light out by reducing the amount of light blocked by the electrical connector 210. The electrical connector 210 can be configured at any angle with respect to the plane $X_C$ (acute, right, or obtuse angles) and can vary from being configured substantially normal with $X_C$ to substantially parallel with $X_C$.

As shown FIG. 5B, once the light emitting die package 310 has cooled from the attachment of the conductive members 216 to the electrical contacts 314, the electrically conductive members 216 can be bent such that the contact base 218 and the rest of the electrically conductive member extend from the plug housing parallel to the plane Xs. In such an embodiment, the plug housing 212 can be configured in relation to the electrically conductive members 216 so that once the electrically conductive members 216 is bent to such a planar position, the plug housing 212 is generally planar with the substrate 312 in the plane Xs.

As shown in FIGS. 5A and 5B, the electrically conductive members 216 can be angled to permit the plug housing to be positioned to one side of the electrically conductive members 216. In this manner, once the electrically conductive members 216 are bent in the bending direction B shown in FIGS. 5A and 5B, the conductive members 216 can be located from about upright to about planar such that the plug housing can reside in a position along the same plane $X_S$ as the substrate 312. Thus, the amount of light blocked by the electrical connector 210 can be further reduced as the plug housing 212 of the electrical connector 210 lies substantially in the same plane $X_S$ as the substrate 312 of the light emitting package 310. In the position illustrated in FIG. 5B, the connector 210 the plug housing 212 can engage a socket 330 of a board to create a lamp assembly 340 to provide a connection that can produce the intend light. As shown in this Figure, the light L can radiate outward throughout the lens 318. This includes the light that would otherwise be blocked by an electrical connector that would extend higher above the electrical contact 314.

Figure 6:
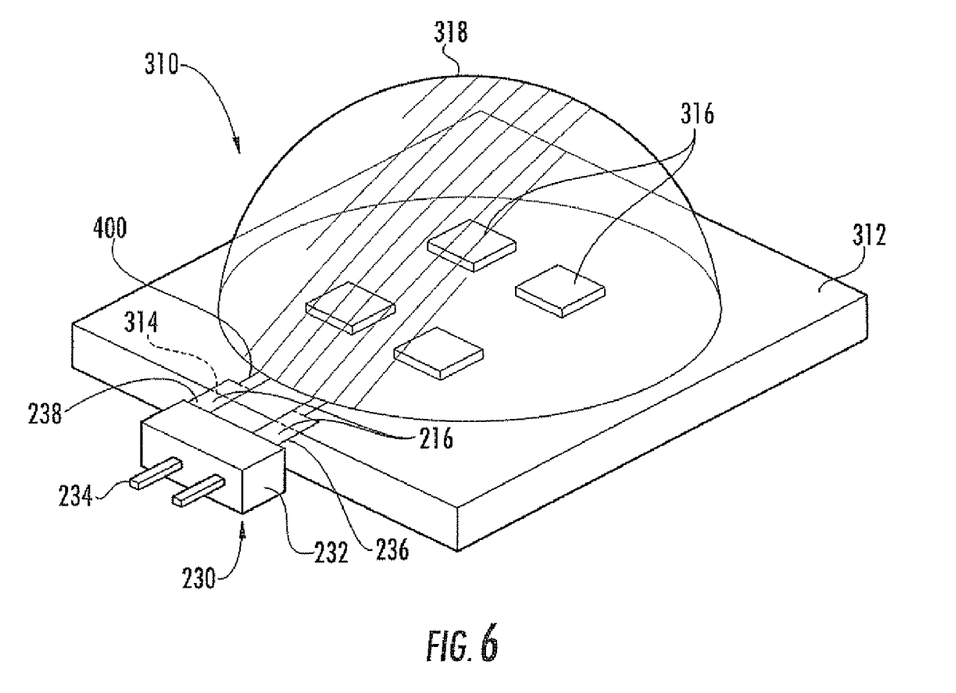
FIG. 6 illustrates a light assembly device with multiple light emitting devices and with a connector in accordance with the subject matter herein.

FIG. 6 illustrates a light emitting device package 310 that comprises an embodiment of an electrical connector 230 that is similar in construction to the electrical connectors shown in FIGS. 3C and 3D. The electrical connector 230 can be a plug for insertion into an electrical source that can be separate and apart from the light emitting package. For example, the electrical source can be a suitable electrical receptacle to the light emitting package, for example, a socket. As shown in FIG. 6, the light emitting device package 310 can be provided comprising a light emitting device 316 and a plug electrically connected to the light emitting device 316 and adapted for providing electrical connection between the light emitting device and an electrical source apart from the light emitting package 310.

The electrical connector 230, or plug, can comprise a plug housing 232 with an electrically conductive socket engaging connection 234 therein for engaging a socket. Plug housing 212 as shown can have different configuration than that illustrated in FIGS. 3C and 3D. Electrical connector 230 can comprise one or more electrically conductive members 236 that can extend outward from the plug housing 232. The electrically conductive members 236 can be connected to the socket engaging connection 234 in a manner to provide an electrical connection. Each electrically conductive member 236 forms a contact base 238 along the same axis for attaching to the electrical contact on a light emitting device package 310. The light emitting device package 310 can comprise a substrate 312 with multiple light emitting devices under one lens 318 and electrical contacts 314 (shown in dotted lines). Multiple light emitting devices, such as light emitting diodes 316, can be electrically connected to electrical traces 400. Traces 400 can electrically connect the light emitting diodes 316 to the electrical contacts 314. Contact bases 238 of the conductive members 236 can be substantially aligned with the electrical contacts 314 to provide electrical connections between the light emitting diodes 316 and the electrical connector 230. While the light emitting device package 310 in FIG. 6 is shown with multiple light emitting devices, it is noted that a single light emitting device, such as a light emitting diode, can be used in such a light emitting device package as described above.

The conductive members 236 can have a length that distances the plug housing 232 and the electrically conductive socket engaging connection 234 from the substrate 312 so that the plug housing 232 and the electrically conductive socket engaging connection 234 are generally unaffected by the heat generated by the attachment or connection process of the contact pad 238 to the electrical contacts 314. In such an embodiment, once the electrical connector 230 is attached to a light emitting device package, the electrical connector 230 can reside in a position that will increase light output by reducing the amount of light blocked by the electrical connector 230.

Figure 7:
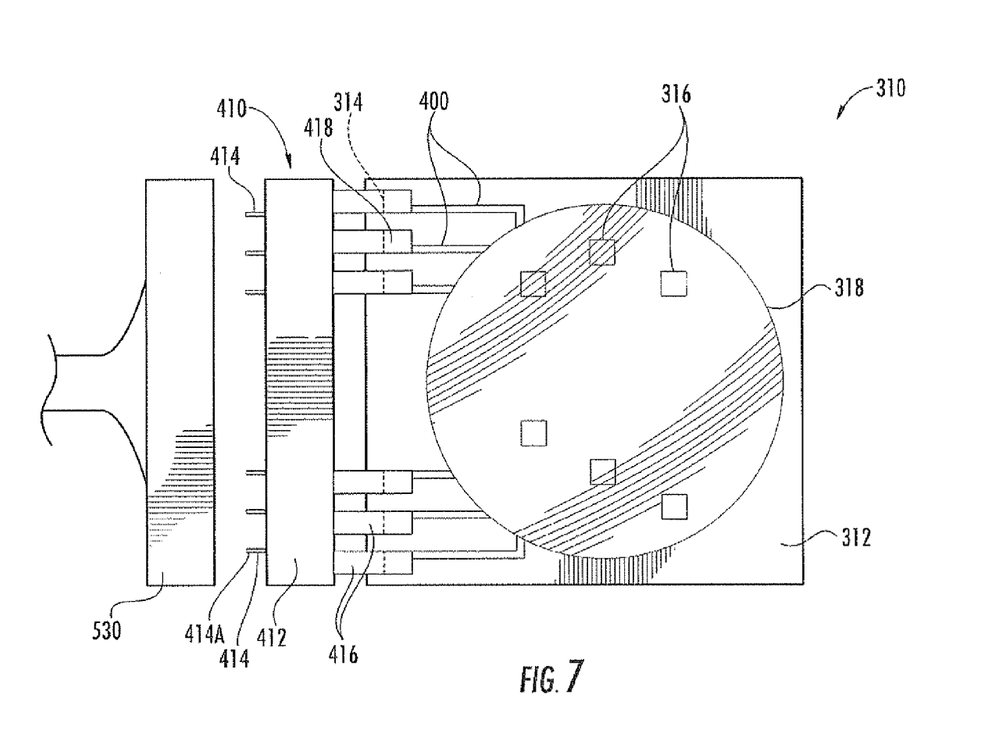
FIG. 7 illustrates a light assembly device with multiple light emitting devices and with a connector in accordance with the subject matter herein.

FIG. 7 illustrates a light emitting device package 310 that can include another embodiment of an electrical connector 410. The light emitting device package 310 can comprise a substrate 312, lens 318, multiple light emitting diodes 316 and electrical traces 400 connecting the light emitting diodes to the electrical contacts 314.

The electrical connector 410 can comprise a plug housing 412 with an electrically conductive socket engaging connection 414 therein for engaging a socket. The electrically conductive socket engaging connection 414 can comprise one or more pins 414A. The electrical connector 410 can comprise one or more electrically conductive members 416 that can extend outward from the plug housing 412. The electrically conductive members 416 can be connected to the socket engaging connection 414 in a manner to provide an electrical connection. The number of pins 414A can correspond to the number of electrically conductive members 416. In the embodiment shown, six pins 414A and conductive members 416 are provided. The number of conductive members 416 can correspond to the number of electrical contacts 314 on the surface of the substrate of the light emitting device package 310. Each electrically conductive member 416 can form a contact base 238 along the same axis for attaching to the electrical contact on a light emitting device package 310. The plug housing 412 with pins 414A therein can be plugged into a socket 530, shown in FIG. 7, to provide the appropriate electrical connection with a board to create a lamp assembly.

While the embodiments shown in the figures and described above illustrate light emitting device packages with a single electrical connector on each package, it is contemplated and possible for a light emitting device package to have multiple separate or joined electrical connectors thereon. For example, the light emitting package illustrated in FIG. 7 can have two or more separate electronic connectors thereon instead of a single electrical connector. For instance, there can be three separate electrical connectors secured to the electrical contacts 314 of the light emitting device package 310. Such multiple electrical connectors can be connected to an electrical source such as being plugged into one or more sockets to provide the appropriate electrical connection. For example, such multiple separate electrical connectors can be plugged into separate sockets or the same socket.

Embodiments of the present disclosure shown in the drawings and described above are exemplary of numerous embodiments that can be made within the scope of the present subject matter. It is contemplated that the configurations of electrical connectors, light emitting device packages, lamp assemblies and methods of assembling light emitting device packages can comprise numerous configurations other than those specifically disclosed.

What is claimed is:

1. An electrical connector for a light emitting device that comprises an electrical contact, the connector comprising:
   a plug housing;
   an electrically conductive socket engaging connection within the plug housing for engaging a socket; and
   an electrically conductive member extending from the plug housing and connected to the socket engaging connection, the electrically conductive member comprising an end distal from the plug housing configured to attach to the electrical contact on a surface of a substrate of the light emitting device, the electrically conductive member being configured to attach to the electrical contact and to bend such that, after attachment, the electrical connector extends out from a side of the substrate of the light emitting device to reduce blockage by the electrical connector of light emitted by the light emitting device package.

2. The connector according to claim 1, wherein the plug housing comprises plastic.

3. The connector according to claim 1, wherein the electrically conductive member comprises a bar.

4. The connector according to claim 1, wherein the electrically conductive socket engaging connection of the plug housing comprises one or more pins.

5. The connector according to claim 1, wherein the end of the electrically conductive member forms a contact base.

6. The connector according to claim 5, wherein the electrically conductive member is planar such that the contact base and the rest of the electrically conductive member extending from the plug housing are disposed along the same axis.

7. The connector according to claim 5, wherein the electrically conductive member is angled with respect to the contact base.

8. The connector according to claim 7, wherein the electrically conductive member is configured to bend proximal to the contact base.

9. The connector according to claim 7, wherein the electrically conductive member comprises an upper portion that extends in one direction with the contact base extending in a different direction.

10. The connector according to claim 9, wherein the contact base of the electrically conductive member extends in a direction that is at least generally orthogonal to the upper portion of the electrically conductive member.

11. The connector according to claim 5, wherein the electrically conductive member comprises an upper portion and the contact base of the electrically conductive member forms a pad from which the upper portion extends.

12. The connector according to claim 11, wherein the contact base of the electrically conductive member is disposed along a plane that is at least generally orthogonal to the upper portion of the electrically conductive member.

13. The connector according to claim 11, wherein the electrically conductive member is configured to bend proximal to the contact base.

14. The connector according to claim 1, further comprising a plurality of electrically conductive members extending from the plug housing and connected to the socket engaging connection with the number of electrically conductive members corresponding to a number of contacts on the light emitting device and each electrically conductive member comprises an end distal from the plug housing that forms a contact base configured to attach to a corresponding electrical contact on the light emitting device.

15. The connector according to claim 14, wherein the electrically conductive socket engaging connection of the plug housing comprises a plurality of pins that correspond to the plurality of electrically conductive members.

16. A light emitting device package comprising:
   a substrate for a light emitting device, the substrate having a top surface and a side;
   an electrical contact disposed on the top surface of the substrate for connection with the light emitting device;
   a light emitting device chip on the top surface of the substrate and electrically connected to the electrical contact;
   an electrical connector comprising:
      a plug housing;
      an electrically conductive socket engaging connection within the plug housing for engaging a socket; and
      an electrically conductive member extending from the plug housing and connected to the socket engaging connection, the electrically conductive member comprising an end distal from the plug housing that forms a contact base attached to the electrical contact on the light emitting device, the electrically conductive member being configured to attach to the electrical contact and to bend such that the electrical connector extends out from the side of the substrate of the light emitting device to reduce blockage by the electrical connector of light emitted by the light emitting device package.

17. The light emitting device package according to claim 16, wherein the plug housing comprises plastic.

18. The light emitting device package according to claim 16, wherein the plug housing comprises heat resistant plastic.

19. The light emitting device package according to claim 16, wherein the electrically conductive socket engaging connection of the plug housing comprises one or more pins.

20. The light emitting device package according to claim 16, wherein the electrically conductive member is angled with respect to the contact base.

21. The light emitting device package according to claim 16, wherein the electrically conductive member is planar such that the contact base and the rest of the electrically conductive member extending from the plug housing are disposed along the same plane.

22. The light emitting device package according to claim 16, wherein the contact base is attached to the electrical contact of the light emitting device by solder reflow.

23. The light emitting device package according to claim 16, wherein the electrically conductive member comprises a bar.

24. The light emitting device package according to claim 16, wherein the substrate comprises a top surface and the electrical contact is disposed on the top surface of the substrate.

25. The light emitting device package according to claim 24, further comprising a plurality of electrical contacts on a top surface of the substrate.

26. The light emitting device package according to claim 25, further comprising a plurality of electrically conductive members extending from the plug housing and connected to the socket engaging connection with each electrically conductive member comprising an end distal from the plug housing that forms a contact base configured to attach to a corresponding electrical contact on the light emitting device.

27. The light emitting device package according to claim 26, wherein the electrically conductive socket engaging connection of the plug housing comprises a plurality of pins that correspond to the plurality of electrically conductive members.

28. The light emitting device package according to claim 16, wherein the electrically conductive member comprises an upper portion that extends in one direction with the contact base extending in a different direction.

29. The light emitting device package according to claim 28, wherein the contact base of the electrically conductive member extends in a direction that is at least generally orthogonal to the upper portion of the electrically conductive member.

30. The light emitting device package according to claim 28, wherein the electrically conductive member is configured to bend proximal to the contact base to reduce blocking of light emitted by the light emitting device package.

31. The light emitting device package according to claim 16, wherein the electrically conductive member comprises an upper portion and the contact base of the electrically conductive member forms a pad from which the upper portion extends.

32. The light emitting device package according to claim 31, wherein the contact base of the electrically conductive member is disposed along a plane that is at least generally orthogonal to the upper portion of the electrically conductive member.

33. The light emitting device package according to claim 31, wherein the electrically conductive member is configured to bend proximal to the contact base to reduce blocking of light emitted by the light emitting device package.

34. A lamp assembly comprising:
    a light-emitting device package comprising:
        a substrate for a light emitting device, the substrate having a top surface and a side; and
        an electrical contact disposed on the top surface of the substrate;
    an electrical connector comprising:
        a plug housing;
        an electrically conductive socket engaging connection within the plug housing for engaging a socket; and
        an electrically conductive member extending from the plug housing and connected to the socket engaging connection, the electrically conductive member comprising an end distal from the plug housing that forms a contact base attached to the electrical contact on the light emitting device, the electrically conductive member being configured to attach to the electrical contact and to bend such that the electrical connector extends out from the side of the substrate of the light emitting device to reduce blockage by the electrical connector of light emitted by the light emitting device package; and
    a socket connected to a board, the socket configured to receive at least a portion of the electrically conductive socket engaging connection of the plug housing.

35. The lamp assembly according to claim 34, wherein the electrically conductive member is angled with respect to the contact base.

36. The lamp assembly according to claim 34, wherein the electrically conductive member is planar such that the contact base and the rest of the electrically conductive member extending from the plug housing are disposed along the same plane.

37. The lamp assembly according to claim 34, wherein the contact base is attached to the electrical contact of the light emitting device by solder reflow.

38. The lamp assembly according to claim 34, wherein the electrically conductive member comprises a bar.

39. The lamp assembly according to claim 34, wherein the electrically conductive member comprises an upper portion that extends in one direction with the contact base extending in a different direction.

40. The lamp assembly according to claim 39, wherein the contact base of the electrically conductive member extends in a direction that is at least generally orthogonal to the upper portion of the electrically conductive member.

41. The lamp assembly according to claim 34, wherein the electrically conductive member comprises an upper portion and the contact base of the electrically conductive member forms a pad from which the upper portion extends.

42. The lamp assembly according to claim 41, wherein the contact base of the electrically conductive member is disposed along a plane that is at least generally orthogonal to the upper portion of the electrically conductive member.

43. A method of assembling a light emitting device package comprising:
    providing a substrate for a light emitting device, the substrate having a top surface and a side and an electrical contact disposed on the top surface of the substrate for connection with the light emitting device;
    providing an electrical connector comprising:
        a plug housing;
        an electrically conductive socket engaging connection within the plug housing for engaging a socket; and
        an electrically conductive member extending from the plug housing and connected to the socket engaging connection, the electrically conductive member comprising an end distal from the plug housing that forms a contact base; and
    attaching the electrically conductive member of the electrical connector to the electrical contact on the light emitting device by attaching the electrically conductive member to the electrical contact and bending the electrically conductive member such that the electrical connector extends out from the side of the substrate of the light emitting device to reduce blockage by the electrical connector of light emitted by the light emitting device package.

44. The method according to claim 43, wherein the electrically conductive member is angled at the contact base such that the electrically conductive member comprises an upper portion that extends in one direction with the contact base extending in a different direction, and further comprising bending the electrically conductive member proximal to the contact base so that the plug housing is in a position that reduces blocking of light emitted by the light emitting device package.

45. The method according to claim 43, wherein the electrically conductive member comprises an upper portion and the contact base of the electrically conductive member forms a pad from which the upper portion extends and further comprising bending the electrically conductive member proximal to the contact base so that the plug housing is in a position that reduces blocking of light emitted by the light emitting device package.

46. The method according to claim 43, wherein the electrically conductive member is planar such that the contact base and the rest of the electrically conductive member extending from the plug housing are disposed along the same plane.

47. The method according to claim 43, wherein the step of attaching the contact base to the electrical contact of the light emitting device comprises reflowing the contact base to the electrical contact.

48. The method according to claim 43, wherein the electrically conductive member comprises a bar.

49. A light emitting device package comprising:

a light emitting device comprising a substrate having a top surface and a side and an electrical contact disposed on the top surface of the substrate and electrically connected with a light emitting chip; and a plug electrically connected to the electrical contact of the light emitting device and adapted for providing electrical connection between the light emitting device and an electrical source apart from the light emitting device package, the plug extending out from the side of the substrate of the light emitting device to reduce blockage by the plug of light emitted by the light emitting device package.

* * * * *